US007602204B2

(12) United States Patent
Lee

(10) Patent No.: US 7,602,204 B2
(45) Date of Patent: Oct. 13, 2009

(54) PROBE CARD MANUFACTURING METHOD INCLUDING SENSING PROBE AND THE PROBE CARD, PROBE CARD INSPECTION SYSTEM

(75) Inventor: Han-Moo Lee, Seoul (KR)

(73) Assignee: Phicom Corporation, Seoul (KR)

( * ) Notice: Subject to any disclaimer, the term of this patent is extended or adjusted under 35 U.S.C. 154(b) by 44 days.

(21) Appl. No.: 11/666,645

(22) PCT Filed: Dec. 19, 2005

(86) PCT No.: PCT/KR2005/004371

§ 371 (c)(1),
(2), (4) Date: Apr. 30, 2007

(87) PCT Pub. No.: WO2006/068388

PCT Pub. Date: Jun. 29, 2006

(65) Prior Publication Data

US 2008/0186041 A1 Aug. 7, 2008

(30) Foreign Application Priority Data

Dec. 24, 2004 (KR) .................. 10-2004-0111691

(51) Int. Cl.
*G01R 31/02* (2006.01)
(52) U.S. Cl. .................................................. 324/762
(58) Field of Classification Search .............. 324/158.1, 324/760–765; 439/862, 68–72; 257/698
See application file for complete search history.

(56) References Cited

U.S. PATENT DOCUMENTS 6,198,273 B1 * 3/2001 Onishi et al. ............. 324/158.1

6,255,126 B1 7/2001 Mathieu et al.
6,917,102 B2 * 7/2005 Zhou et al. .................. 257/698
7,119,560 B2 * 10/2006 Nihei et al. ................. 324/754
7,377,788 B2 * 5/2008 Hasegawa .................... 439/66

FOREIGN PATENT DOCUMENTS

KR 10200440079 A 5/2004
KR 1020040074127 A 8/2004

OTHER PUBLICATIONS

PCT Search Report dated Mar. 17, 2006 for PCT No. KR2005/004371.
PCT Written Opinion dated Mar. 17, 2006 for PCT No. KR2005/004371.

\* cited by examiner

*Primary Examiner*—Ha Tran T Nguyen
*Assistant Examiner*—Trung Q Nguyen
(74) *Attorney, Agent, or Firm*—Jenkins, Wilson, Taylor & Hunt, P.A.

(57) ABSTRACT

There is provided a method of manufacturing a probe card. A first passivation pattern for implementing a tip portion of an electrical inspection probe and a tip portion of a planarity sensing probe on a sacrificial substrate is formed, and an etching process using the first passivation pattern as an etch mask is performed to form a first trench in the sacrificial substrate. The first passivation pattern is removed, and a second passivation pattern having bar-type first openings exposing the first trench is formed. A conductive material is provided in the openings to form beam portions connected respectively to the tip portions of the inspection and sensing probes, thereby forming the inspection probe and the sensing probe. The beam portions of the inspection and sensing probes are bonded to a multi-layer circuit board. The sacrificial substrate is removed to expose the inspection probe and the sensing probe.

13 Claims, 13 Drawing Sheets

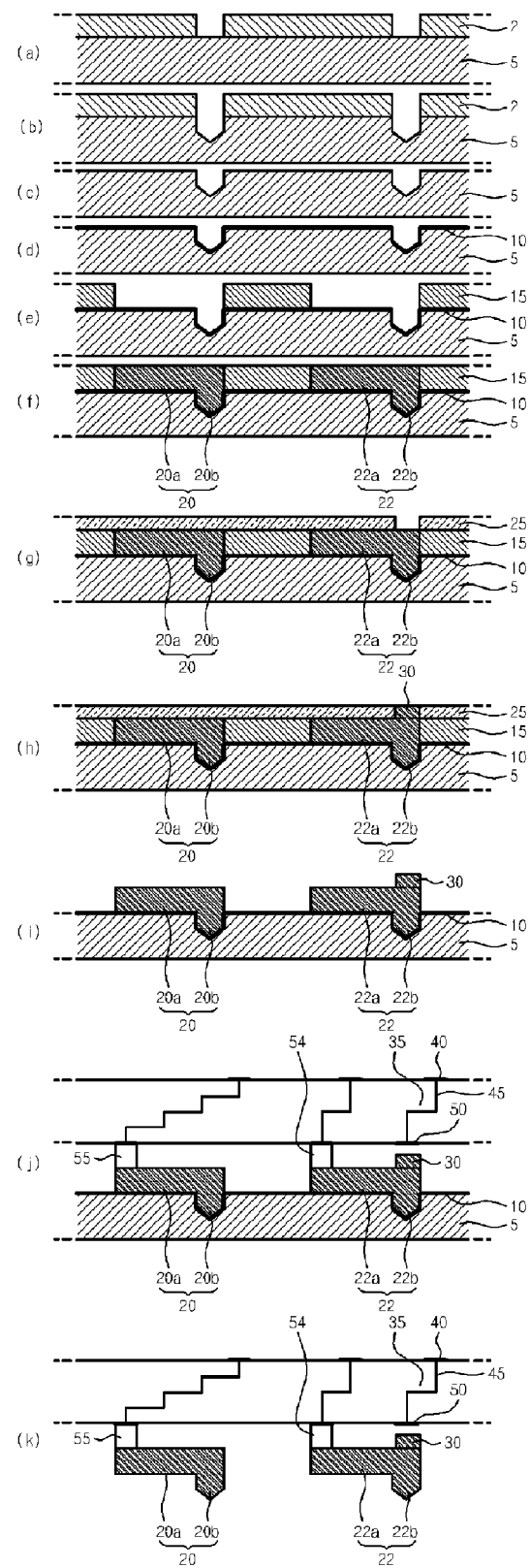
[Fig. 1]

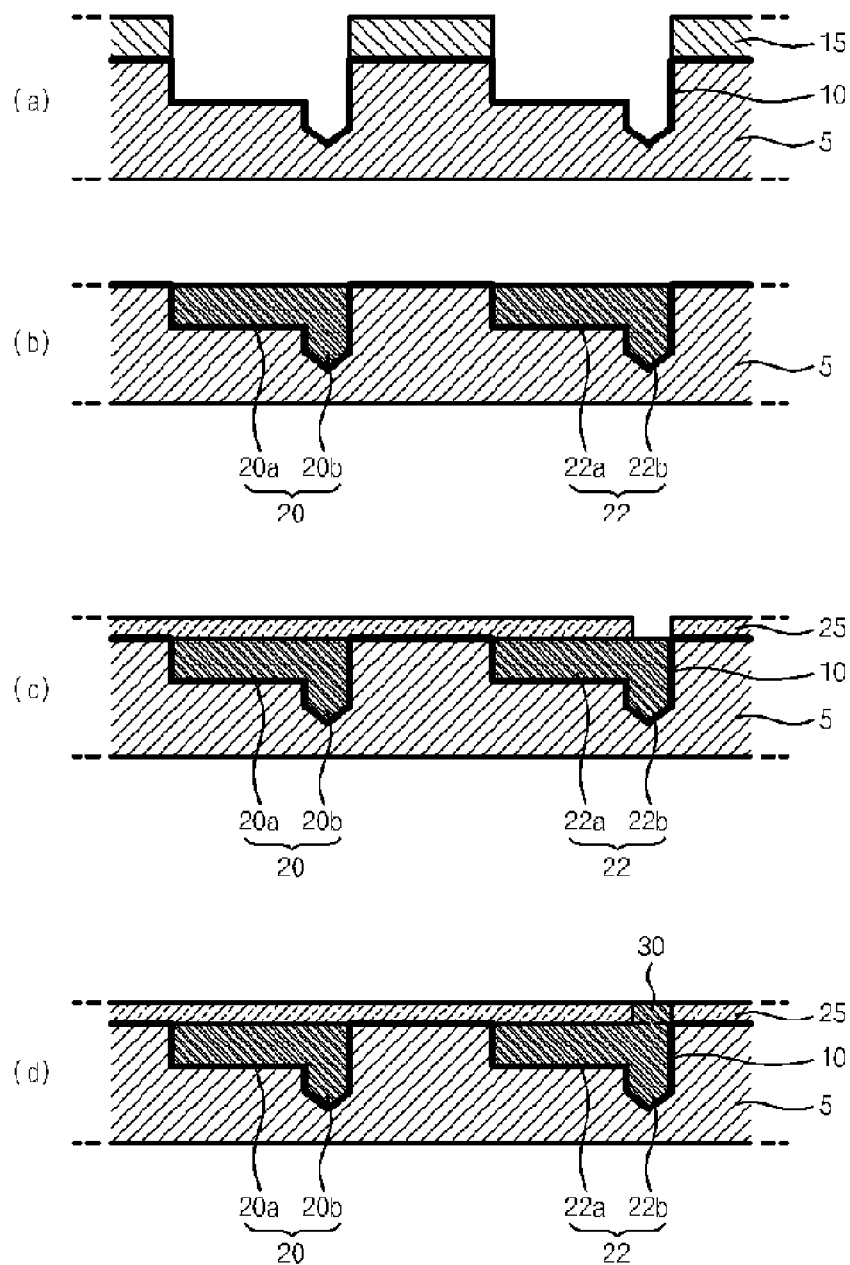
[Fig. 2]

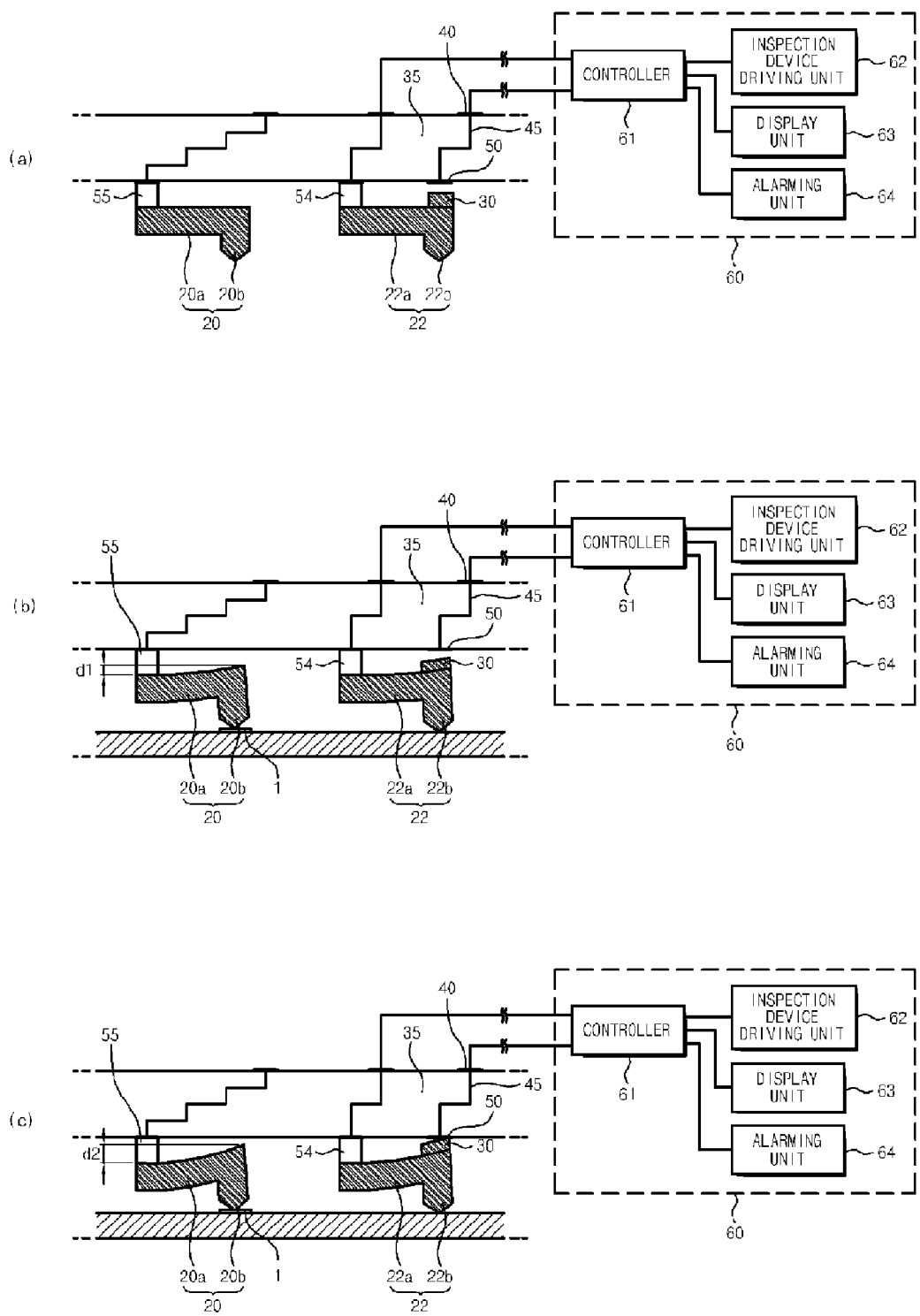
[Fig. 3]

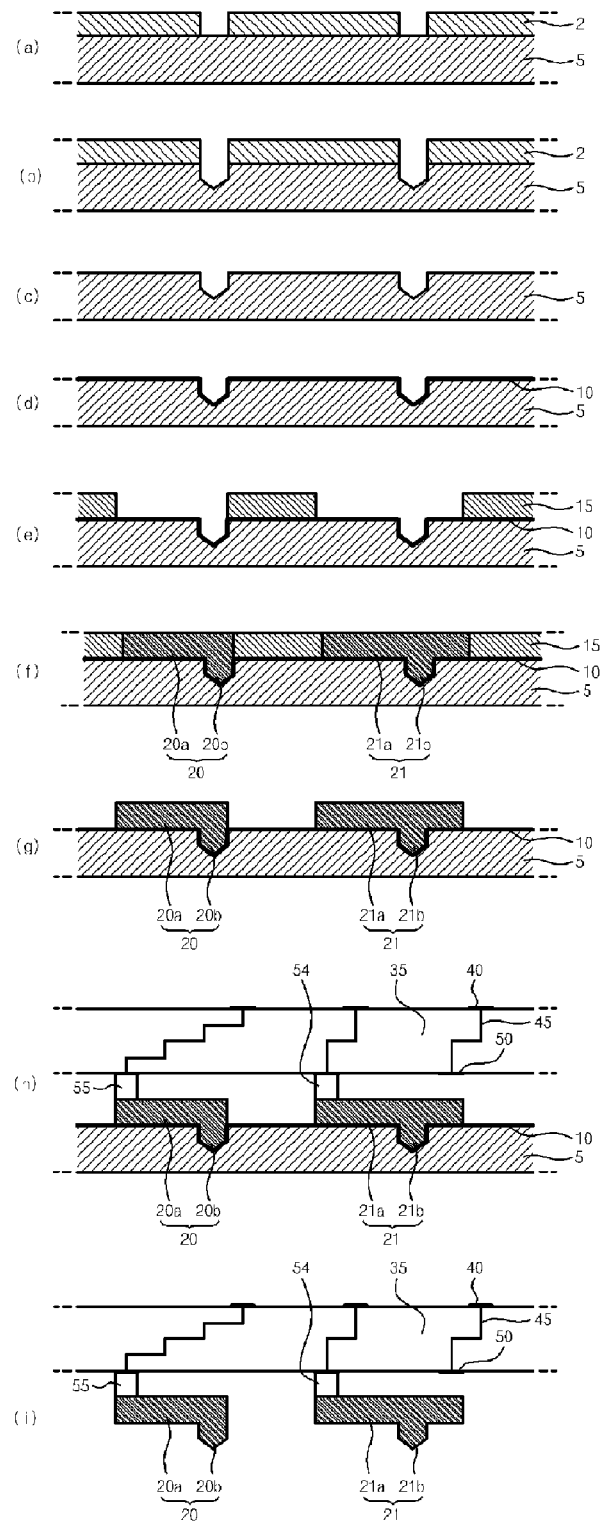
[Fig. 4]

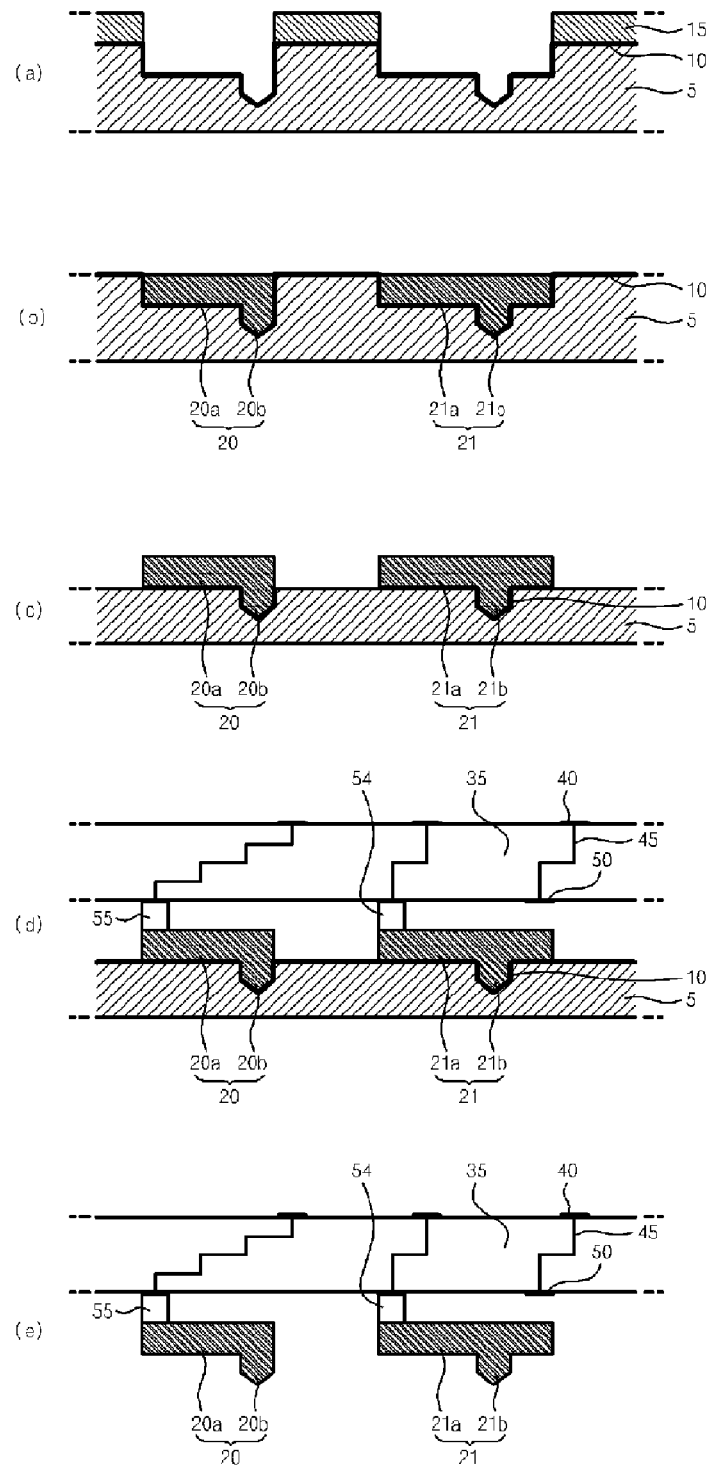
[Fig. 5]

[Fig. 6]
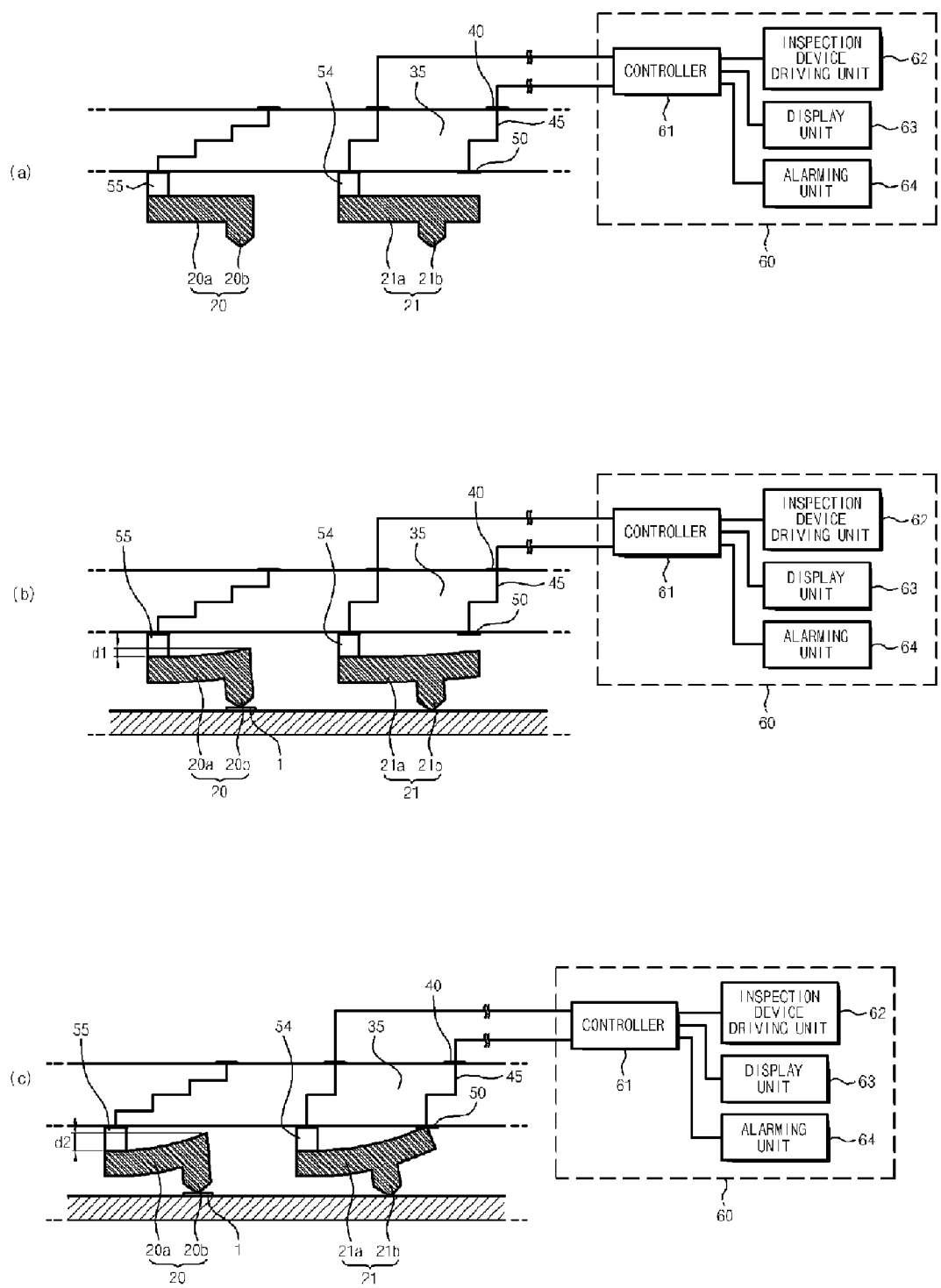

[Fig. 7]
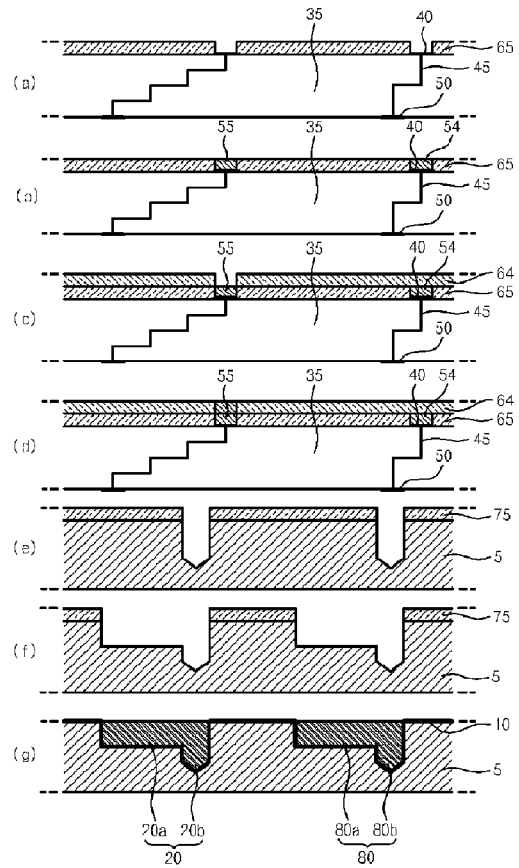
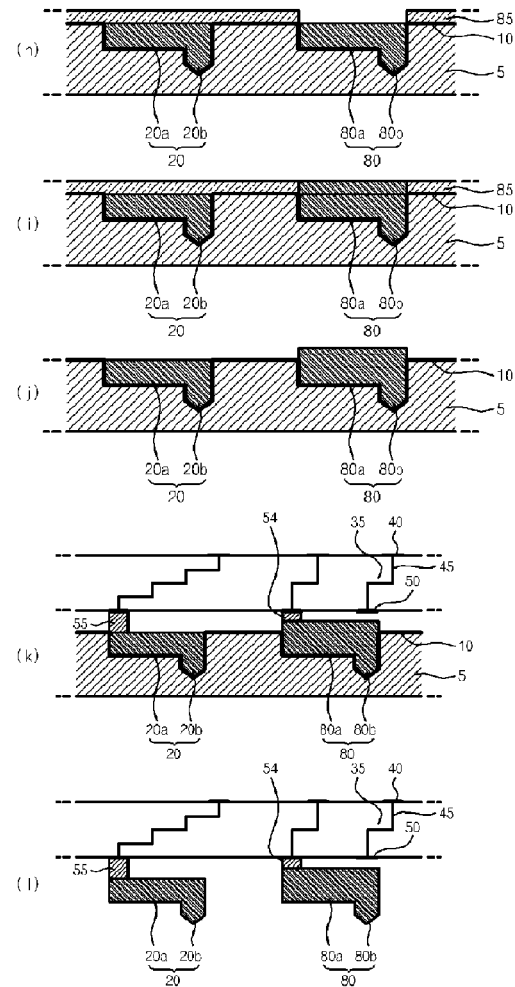
[Fig. 8]
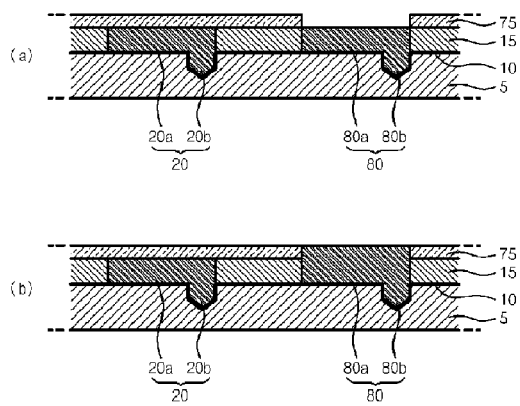

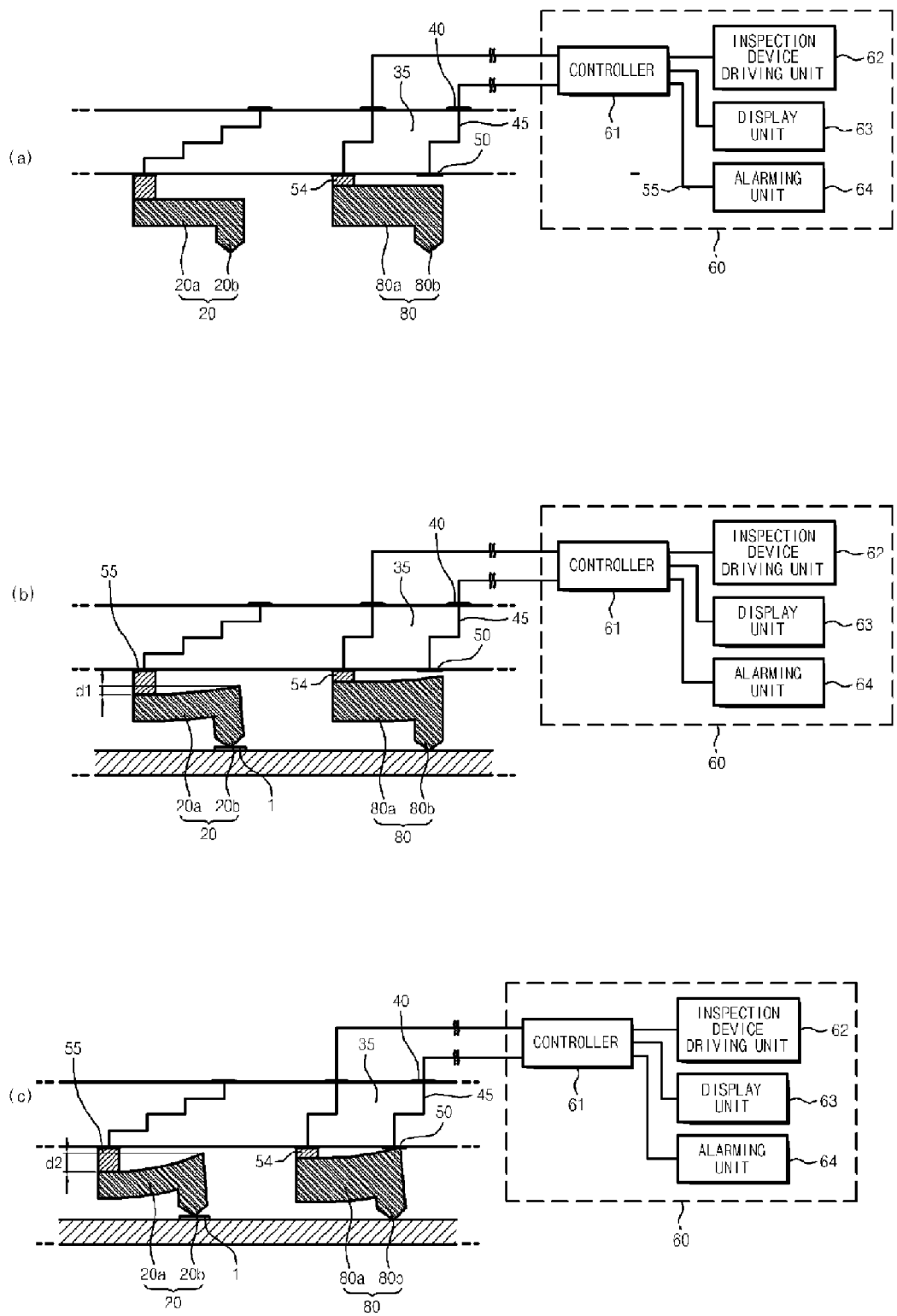

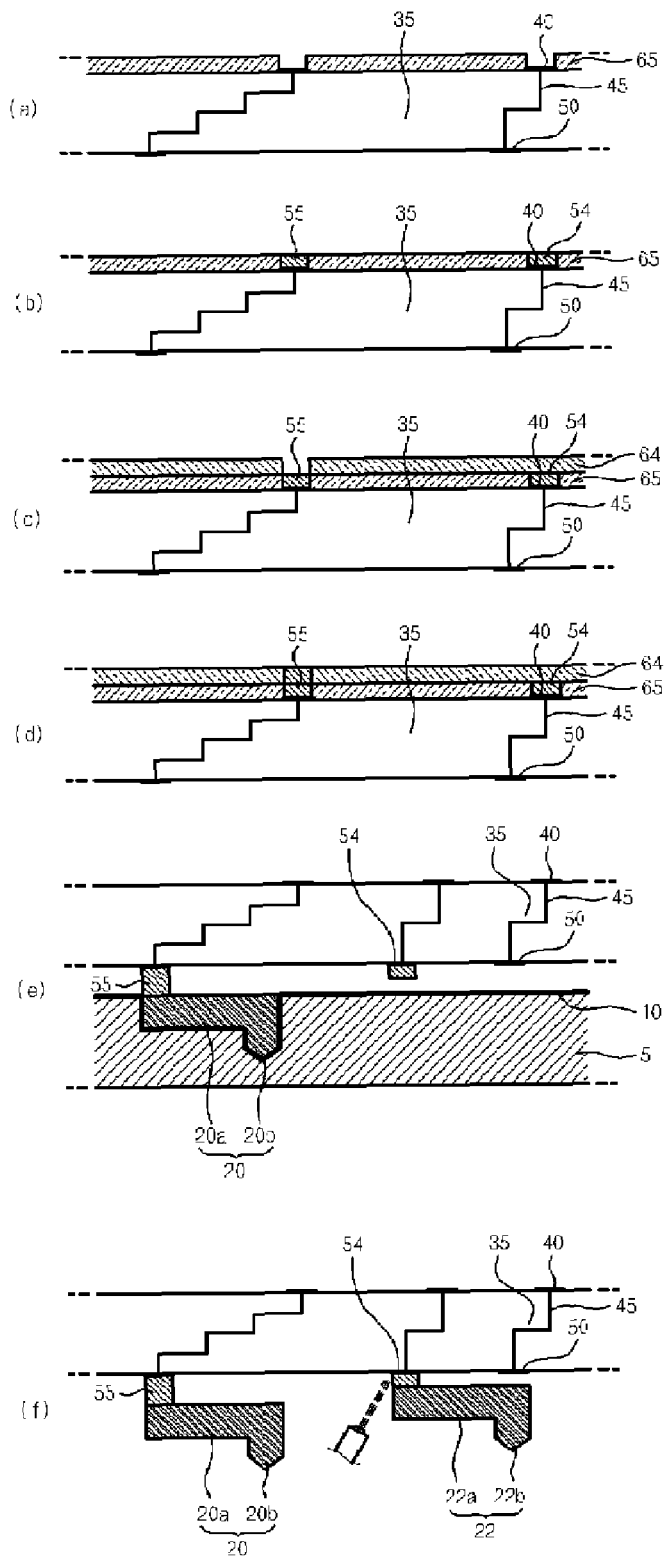
[Fig. 10]

[Fig. 11]
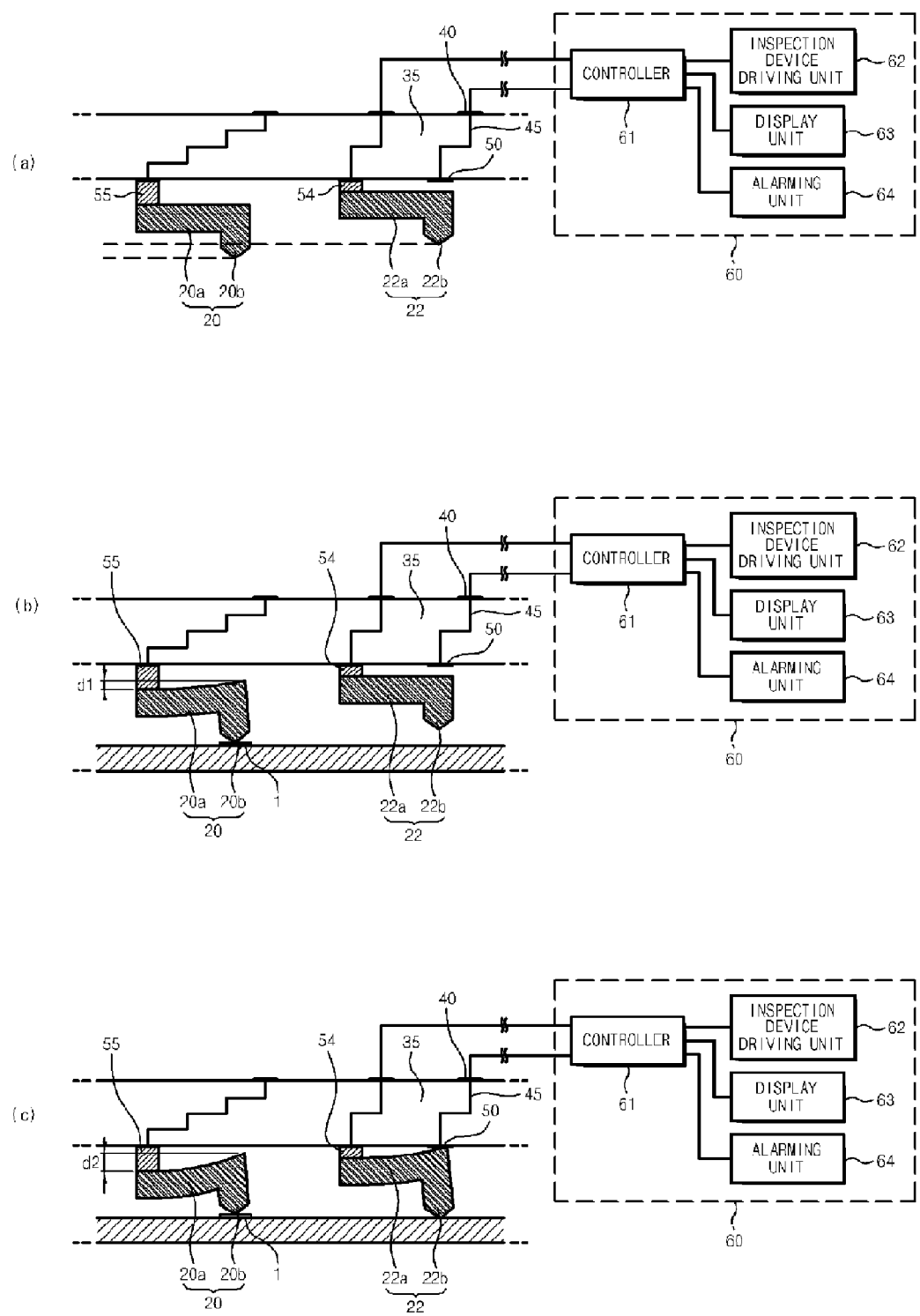

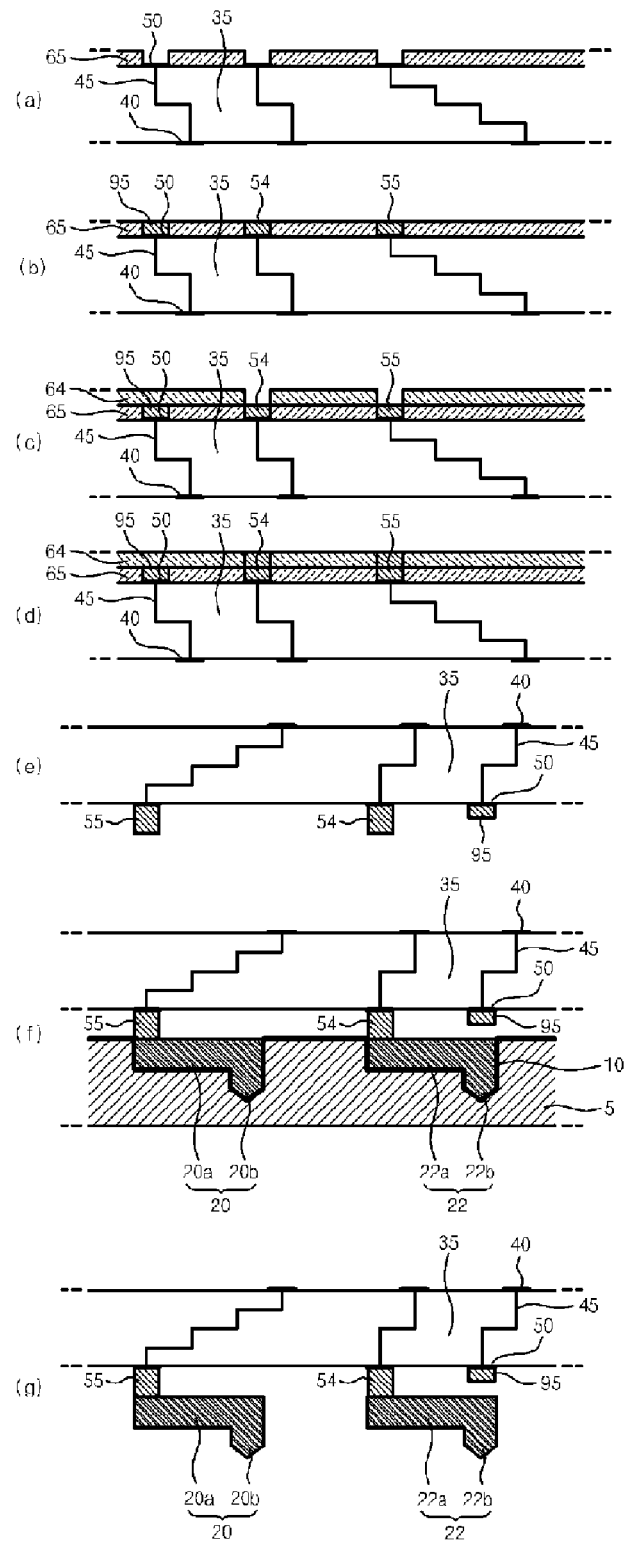
[Fig. 12]

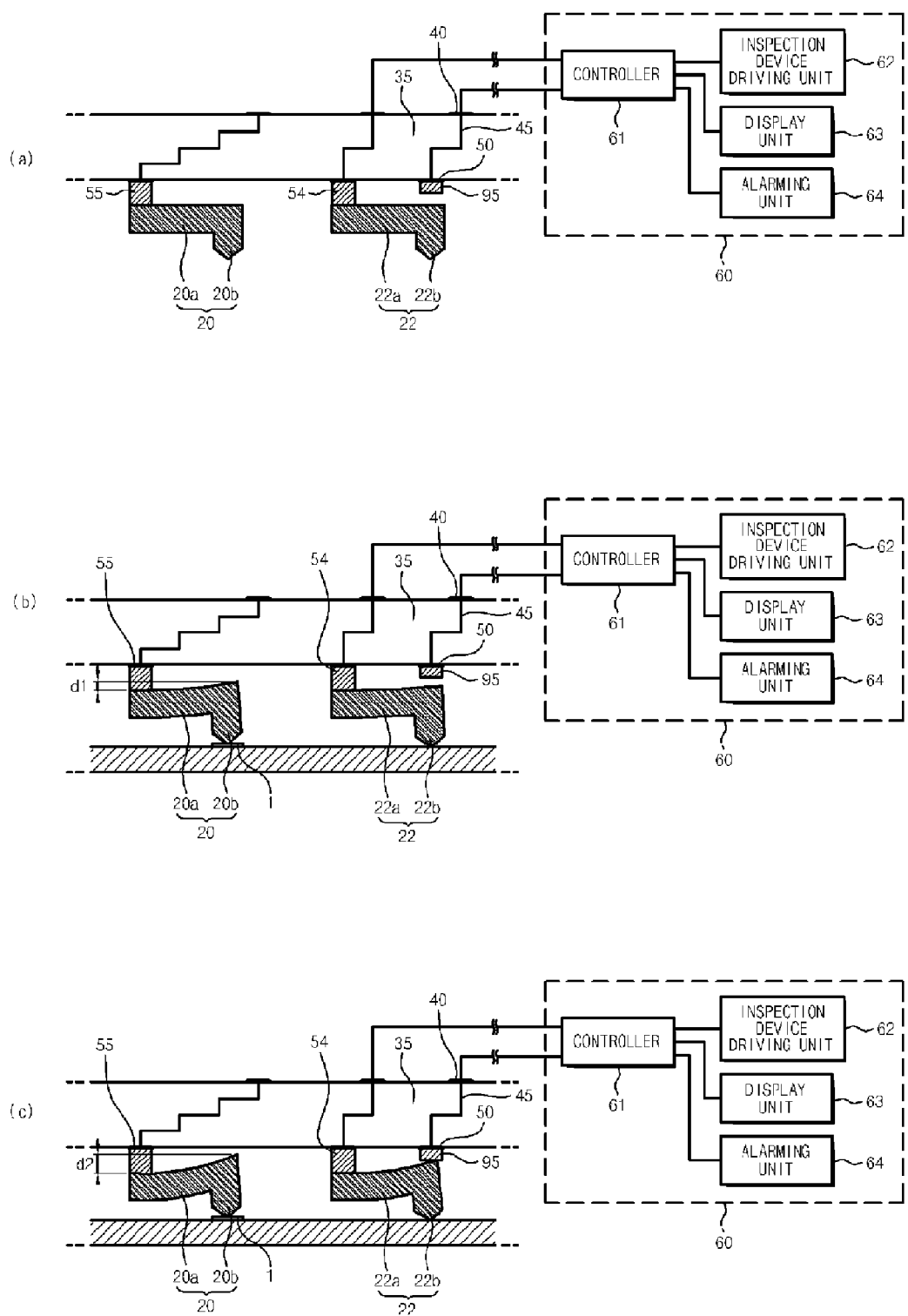

[Fig. 14]
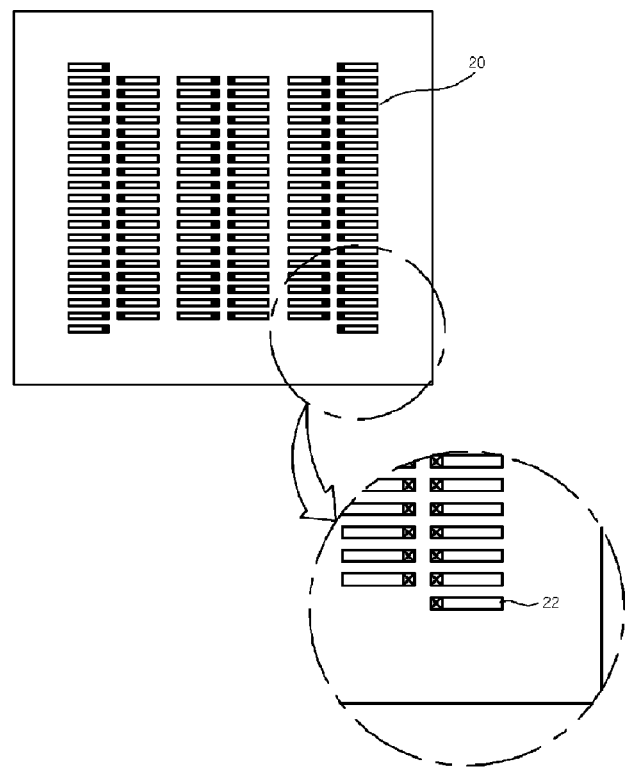
[Fig. 15]
(a)
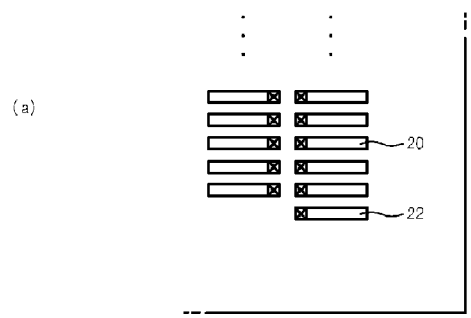
(b)
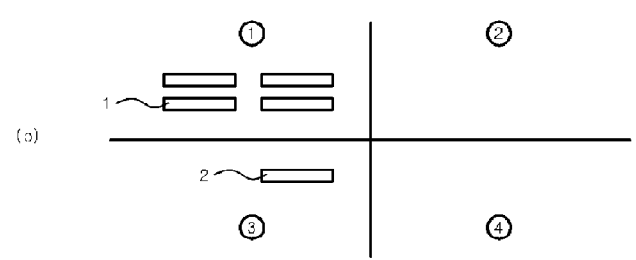

PROBE CARD MANUFACTURING METHOD INCLUDING SENSING PROBE AND THE PROBE CARD, PROBE CARD INSPECTION SYSTEM

TECHNICAL FIELD

The present invention relates to a method of manufacturing a probe card including a sensing probe, the probe card, and a system for inspecting the probe card. More particularly, the present invention relates to the method of manufacturing the probe card including the sensing probe that is provided separately from an inspection probe so as to be able to sense an over drive (OD) of a probe and a planarity of a wafer, the probe card, and the system for inspecting the probe card.

BACKGROUND ART

A semiconductor manufacturing process includes a series of processes of arranging a plurality of chips on a silicon wafer and packaging and cutting the resulting structure into separate chips. In order to package and cut the resulting structure into a plurality of chips, a process of applying an electrical signal to the respective chips to check whether or not the respective chips operate normally must be performed. This process is called a semiconductor inspection process. The semiconductor inspection process is performed using a probe card having a contact member corresponding to a chip formed on the silicon wafer. The contact member is brought into contact with the chip on the silicon wafer and the electrical signal is applied thereto to check whether or not the chip operates normally. This contact member is hereinafter referred to as a probe.

The semiconductor inspection process includes operations of disposing a desired silicon wafer on a wafer chuck, bringing a probe tip into contact with a desired pad on the silicon wafer, and performing a desired inspection by applying the electrical signal to the desired pad while pressing the probe tip with a predetermined physical force.

At this time, a sufficient over drive (OD) must be applied in order to bring all the probe tips of the probe card into contact with the desired pads of the silicon wafer. Also, the sufficient OD must be constantly maintained in order to prevent the fatal damage of the pads. This requires means for sensing the current state of the OD in real time.

Also, a constant planarity of the silicon wafer disposed on the wafer chuck must be always maintained in order to bring the probe tips into precise contact with the corresponding pads and to prevent the damage of the pads. Therefore, it is required to develop means for accurately sensing the planarity of the silicon wafer in real time.

DISCLOSURE OF INVENTION

Technical Problem

The present invention provides a method of manufacturing a probe card including a sensing probe, the probe card, and a system for inspecting the probe card, wherein the sensing probe is separately formed on a circuit board in an MEMS method used for an inspection probe for inspecting an inspection pad of a semiconductor device, and is configured to sense an over drive (OD) of a probe applied to a silicon wafer with a highly-integrated semiconductor device and to sense a planarity of the silicon wafer with respect to the probe card.

The present invention also provides a method of manufacturing a probe card including a sensing probe, the probe card, and a system for inspecting the probe card, which can display information about an OD of a probe sensed by the sensing probe and about a planarity of a silicon wafer with respect to the probe card on a screen of a terminal such as a PC so that a operator checks up information about the OD and the planarity in real time.

The present invention also provides a method of manufacturing a probe card including a sensing probe, the probe card, and a system for inspecting the probe card, which can store information about an OD of a probe sensed by the sensing probe and about a planarity of a silicon wafer with respect to the probe card in a terminal such as a PC so that the next operator can use the stored OD and planarity information.

Technical Solution

Embodiments of the present invention provide methods of manufacturing a probe card. In the methods, a first passivation pattern for implementing a tip portion of an electrical inspection probe and a tip portion of a planarity sensing probe on a sacrificial substrate is formed, and an etching process using the first passivation pattern as an etch mask is performed to form a first trench in the sacrificial substrate. The first passivation pattern is removed, and a second passivation pattern having bar-type first openings exposing the first trench is formed. A conductive material is provided in the first openings to form beam portions connected respectively to the tip portions of the inspection and sensing probes, thereby forming the inspection probe and the sensing probe. The beam portions of the inspection and sensing probes are bonded to a multi-layer circuit board. The sacrificial substrate is removed to expose the inspection probe and the sensing probe.

The second passivation pattern may be formed such that a longitudinal edge of the first openings is aligned with one side of the first trench.

In some embodiments, the method may further include, after the forming of the inspection and sensing probes: forming a third passivation pattern having a second opening exposing the beam portion of the sensing probe formed on the tip portion thereof; providing a conductive material in the second opening to form a signal projecting portion on the tip portion of the sensing probe; and removing the third passivation pattern. The method may further include, after the forming of the second passivation pattern, etching the sacrificial substrate using the second passivation pattern as an etch mask, thereby forming a second trench.

In further embodiments, the second passivation pattern may be formed such that the longitudinal edge of the first openings is aligned with one side of the first trench in a region where the inspection probe is to be formed and the first trench is disposed at the center portion of the first openings in a region where the sensing probe is to be formed. The method may further include, after the forming of the second passivation pattern, etching the sacrificial substrate using the second passivation pattern as an etch mask, thereby forming the second trench.

In other embodiments, the method may further include: forming a third passivation pattern having a third opening exposing the beam portion of the sensing probe; and providing a conductive material in the third opening to form the beam portion of the sensing probe thicker than the beam portion of the inspection probe.

In other embodiments, the inspection probe and the sensing probe may be bonded to the multi-layer circuit board by bumps formed on the multi-layer circuit board, and the bump corresponding to the inspection probe may be formed thicker than the bump corresponding to the sensing probe.

In other embodiments, the method may further include: preparing the multi-layer circuit board; forming a (1-a)th passivation pattern for implementing a plurality of bumps on the multi-layer circuit board; depositing a conductive material in the (1-a)th passivation pattern to form the bumps; sequentially forming one or more (1-b)th passivation patterns for selectively exposing the bumps; and depositing a conductive material in the (1-b)th passivation pattern to separately adjust heights of the bumps.

In some embodiments of the present invention, a method of forming a probe card includes: preparing an inspection probe for electrical inspection and a sensing probe for sensing planarity, each of the inspection and sensing probes having a bar-type beam portion and a tip portion connected to one end of the beam portion; and bonding the beam portions of the inspection and sensing probes to a multi-layer circuit board, wherein the inspection probe and the sensing probe are bonded to the multi-layer circuit board by bumps formed on the multi-layer circuit board, and the bump corresponding to the inspection probe is formed thicker than the bump corresponding to the sensing probe. The sensing probe may be bonded to the multi-layer circuit board using a laser.

In further embodiments of the present invention, a method of forming a probe card includes: forming an inspection probe for electrical inspection and a sensing probe for sensing planarity on a sacrificial substrate, each of the inspection and sensing probes having a bar-type beam portion and a tip portion attached to the beam portion; preparing a multi-layer circuit board; forming a signal projecting portion on the multi-layer circuit board at a position corresponding to the tip portion of the sensing probe; bonding the beam portions of the inspection and sensing probes through bumps on the multi-layer circuit board, the bump being higher than the signal projecting portion; and removing the sacrificial substrate to expose the inspection probe and the sensing probe.

In still further embodiments of the present invention, a probe card includes: a multi-layer circuit board having one or more bumps receiving external electrical signals; a cantilever-type inspection probe having a bar-type beam portion, an upper surface of one end of the bar-type beam portion being bonded to the bump of the multi-layer circuit board, and a tip portion attached to a lower surface of the other end of the beam portion and configured to contact a pad of a semiconductor chip by pressure; and a sensing unit configured to sense the level of an over drive (OD) applied to the inspection probe when the inspection probe is brought into contact with the pad of the semiconductor chip.

In some embodiments, the sensing unit includes: a cantilever-type sensing probe having a bar-type beam portion, an upper surface of one end of the bar-type beam portion being bonded to the bump of the multi-layer circuit board, a signal projecting portion being provided on an upper surface of the other end of the bar-type beam portion, and a tip portion attached to a lower surface of the other end of the beam portion and configured to contact the pad of the semiconductor chip by pressure; and a signal connection terminal disposed on the multi-layer circuit board to sense contact with the signal projecting portion when the OD exceeds a predetermined level.

In further embodiments, the sensing unit includes: a cantilever-type sensing probe having a bar-type beam portion, an upper surface of one end of the bar-type beam portion being bonded to the bump of the multi-layer circuit board, and a tip portion attached to a lower surface of the center portion of the beam portion and configured to contact the pad of the semiconductor chip by pressure; and a signal connection terminal disposed on the multi-layer circuit board to sense contact with the other end of the bar-type beam portion when the OD exceeds a predetermined level.

In other embodiments, the sensing unit includes: a cantilever-type sensing probe having a bar-type beam portion, an upper surface of one end of the bar-type beam portion being bonded to the bump of the multi-layer circuit board, and a tip portion attached to a lower surface of the other end of the beam portion and configured to contact the pad of the semiconductor chip by pressure; and a signal connection terminal disposed on the multi-layer circuit board to sense contact with the other end of the bar-type beam portion when the OD exceeds a predetermined level, wherein the beam portion of the cantilever-type sensing probe is thicker than the beam portion of the inspection probe.

In other embodiments, the sensing unit includes: a cantilever-type sensing probe having a bar-type beam portion, an upper surface of one end of the bar-type beam portion being bonded to the bump of the multi-layer circuit board, and a tip portion attached to a lower surface of the other end of the beam portion and configured to contact the pad of the semiconductor chip by pressure; and a signal connection terminal disposed on the multi-layer circuit board to contact the other end of the bar-type beam portion when the OD exceeds a predetermined level, wherein the bump bonded to the inspection probe is thicker than the bump bonded to the sensing probe.

In other embodiments, the sensing unit includes: a cantilever-type sensing probe having a bar-type beam portion, an upper surface of one end of the bar-type beam portion being bonded to the bump of the multi-layer circuit board, and a tip portion attached to a lower surface of the other end of the beam portion and configured to contact the pad of the semiconductor chip by pressure; a signal projecting portion disposed on the multi-layer circuit board at a position corresponding to the tip portion of the sensing probe; and a signal connection terminal disposed on the multi-layer circuit board to sense that the other end of the bar-type beam portion is brought into contact with the signal projecting portion when the OD exceeds a predetermined level, wherein the bump bonded to the sensing probe is thicker than the signal projecting portion.

In other embodiments, the sensing unit is installed at a predetermined portion of the multi-layer circuit board near the inspection probe, the sensing unit including a contact sensor, a pressure sensor or an optical sensor brought into contact with a semi-conductor test chip when the OD exceeds a predetermined level.

In still further embodiments of the present invention, a probe card inspection system includes: a probe card including: a multi-layer circuit board having one or more connection terminals receiving external electrical signals, bumps disposed on the connection terminals of the multi-layer circuit board, a cantilever-type inspection probe having a bar-type beam portion, an upper surface of one end of the bar-type beam portion being bonded to the bump of the multi-layer circuit board, and a tip portion attached to a lower surface of the other end of the beam portion and configured to contact a pad of a semiconductor chip by pressure, and a sensing unit configured to sense a level of an OD applied to the inspection probe; a controller receiving an electrical signal corresponding to the level of the OD sensed by the sensing unit, and comparing the sensed level of the OD with a predetermined OD level to control the system; an inspection device driving unit controlling an operation of an inspection device under the control of the controller; and a display unit the OD level according to a control signal of the controller.

The probe card inspection system may further include an alarming unit generating an alarm signal in response to the control signal of the controller.

The sensing unit comprises a sensing probe separated from the inspection probe.

The sensing probe may contact a dummy pad of the semiconductor chip.

The sensing unit may include a contact sensor, a pressure sensor or an optical sensor.

Advantageous Effects

According to the method of manufacturing the probe card including the sensing probe, the sensing probe is separately formed on a circuit board in an MEMS method used for an inspection probe for inspecting an inspection pad of a semiconductor device, and is configured to sense the over drive (OD) of a probe applied to a silicon wafer with a highly-integrated semiconductor device and to sense the planarity of the silicon wafer with respect to the probe card. Accordingly, the inspection process can be efficiently performed.

Also, according to the probe card manufactured by the above method, information about the OD of the probe sensed by the sensing probe and about the planarity of the silicon wafer with respect to the probe card is stored in a monitoring terminal such as a PC so that the next operator can use the stored OD and planarity information. Accordingly, an unnecessary manufacturing process can be prevented to reduce the number and time of the manufacturing processes. Consequently, the manufacturing efficiency can be enhanced.

BRIEF DESCRIPTION OF THE DRAWINGS

FIG. 1 is a sectional view illustrating a method of manufacturing a probe card including an over drive (OD) sensing probe according to an embodiment of the present invention.

FIG. 2 is a sectional view illustrating another method of manufacturing the probes of FIG. 1.

FIG. 3 is a schematic view of a system for inspecting the probe card manufactured by the methods illustrated in FIGS. 1 and 2.

FIG. 4 is a sectional view illustrating a method of manufacturing a probe card including an OD sensing probe according to another embodiment of the present invention.

FIG. 5 is a sectional view illustrating another method of manufacturing the probes of FIG. 4.

FIG. 6 is a schematic view of a system for inspecting the probe card manufactured by the methods illustrated in FIGS. 4 and 5.

FIG. 7 is a sectional view illustrating a method of manufacturing a probe card including an OD sensing probe according to a further embodiment of the present invention.

FIG. 8 is a sectional view illustrating another method of manufacturing the probes of FIG. 7.

FIG. 9 is a schematic view of a system for inspecting the probe card manufactured by the methods illustrated in FIGS. 7 and 8.

FIG. 10 is a sectional view illustrating a method of manufacturing a probe card including an OD sensing probe according to a still further embodiment of the present invention.

FIG. 11 is a schematic view of a system for inspecting the probe card manufactured by the method illustrated in FIG. 10.

FIG. 12 is a sectional view illustrating a method of manufacturing a probe card including an OD sensing probe according to a yet further embodiment of the present invention.

FIG. 13 is a schematic view of a system for inspecting the probe card manufactured by the method illustrated in FIG. 12.

FIG. 14 is a view illustrating an OD sensing probe according to another embodiment of the present invention.

FIG. 15 is a view illustrating pads and dummy pads formed on a wafer in such a way to be matched to a probe card.

BEST MODE FOR CARRYING OUT THE INVENTION

In the following detailed descriptions about the embodiments of the present invention, probes for inspecting the state of a pad on a wafer are commonly called an inspection probe, and probes for sensing an over drive (OD) generated during the inspection of the pad or a planarity of the wafer are commonly called a sensing probe.

FIG. 1 is a sectional view illustrating a method of manufacturing a probe card including an OD sensing probe according to the best mode embodiment of the present invention.

Referring to FIG. 1(a), a passivation layer (not illustrated) made of an oxide layer is formed on a sacrificial substrate 5 made of a silicon material with a predetermined direction such as (1 0 0).

Thereafter, a photoresist is coated on the sacrificial substrate 5 on which the passivation layer has been formed, and a photolighography process for exposure and development and an oxide layer etching process are sequentially performed to form first passivation patterns 2 that will be used as an etch mask in an etching process later on.

Referring to FIG. 1(b), a wet etching process and an anisotropic dry etching process are sequentially performed using the first passivation patterns 2, thereby forming a trench corresponding to a tip of a probe on the sacrificial substrate 5.

That is, although not illustrated in the drawings, the forming of the trench using the first passivation patterns 2 includes performing the wet etching process to form a shallow trench corresponding to an end portion of the tip of the probe and performing the anisotropic dry etching process to deepen the shallow trench.

The shallow trench corresponding to the end portion of the tip of the probe may be formed in various shapes, such as a cone and a pyramid, according to the shape of the first passivation patterns 2. The anisotropic dry etching process is a deep trench etching process such as a publicly-known reactive ion etching (RIE) process called a Bosh process.

Referring to FIG. 1(c), a wet etching process is performed to remove the first passivation patterns 2. Referring to FIG. 1(d), a sputtering process is performed to form, on the sacrificial substrate 5, a seed layer 10 of, for example, copper (Cu) functioning as a seed in the subsequent plating process.

Referring to FIG. 1(e), a photoresist is coated on the resulting structure, and an exposure and development process is performed to form a second passivation patterns 15 having pattern spaces with the shapes of the sections of support beams of an inspection probe and a sensing probe, thereby forming pattern spaces for forming the support beams by the subsequent metal depositing process.

Referring to FIG. 1(f), a conductive material is deposited by plating into the pattern spaces exposed through the second passivation patterns 15, and a planarization process including a chemical mechanical polishing (CMP) process, an etchback process, and a grinding process is performed to form an inspection probe 20 and a sensing probe 22. Consequently, the inspection probe 20 includes a beam portion 20a and a tip portion 20b formed in a body with the beam portion 20a, and the sensing probe 22 includes a beam portion 22a and a tip portion 22b formed in a body with the beam portion 22a.

Alternatively, the inspection probe 20 and the sensing probe 22 may be formed using a chemical vapor deposition (CVD) process or a physical vapor deposition (PVD) process, instead of the plating process.

Referring to FIG. 1(g), third passivation patterns 25 are formed on the resulting structure such that it has a pattern space with the shape of the section of a signal projecting portion, on a partial upper surface of the beam portion 22a corresponding to the tip portion 22b, thereby forming a space portion for forming the signal projecting portion by the subsequent metal depositing process.

Referring to FIG. 1(h), a conductive material is deposited by plating into the space portion formed between the third passivation patterns 25, thereby forming the signal projecting portion 30.

Referring to FIG. 1(i), a wet etching process is performed to remove the second passivation patterns 15 and the third passivation patterns 25.

Referring to FIG. 1(j), upper end portions of the beam portions 20a and 22a of the inspection and sensing probes 20 and 22 are respectively bonded to bumps 55 and 54 formed on a multi-layer circuit board 35.

Referring to FIG. 1(k), a wet etching process is performed to remove the sacrificial substrate 5 and thus expose the inspection probe 20 and the sensing probe 22, thereby completing a probe card.

FIG. 2 is a sectional view illustrating another method of manufacturing the probes of FIG. 1. In this method, a wet etching process and an anisotropic dry etching process are sequentially performed on a sacrificial substrate 5 to form an inspection probe 20 and a sensing probe 22 in the sacrificial substrate 5, and a plating process is performed to form a signal projecting portion in a body with the sensing probe 22. In describing the embodiment of FIG. 2, the same elements as in FIG. 1 are denoted by the same reference numerals, and descriptions about the same processes as in FIG. 1 will be omitted for conciseness.

Referring to FIG. 2(a), the same processes as in FIGS. 1(a) to 1(c) are performed to form first passivation patterns 15, which have pattern spaces with the shapes of the sections of beam portions of the inspection and sensing probes, on the sacrificial substrate 5 where trenches for forming tip portions of probes have been formed.

Thereafter, an etching process is performed using the first passivation patterns 15 as an etch mask, thereby forming, in the sacrificial substrate 5, trenches where the beam and tip portions of the inspection probe and the beam and tip portions of the sensing probe will be formed.

Referring to FIG. 2(b), a seed layer 10 is formed on the sacrificial substrate 5, and a conductive material is deposited by plating into the trenches to form the inspection probe 20 and the sensing probe 22.

Referring to FIG. 2(c), third passivation patterns 25, which has a space portion with the shape of the section of a signal projecting portion, on a partial upper surface of a beam portion 22a corresponding to a tip portion 22b of the sensing probe 22, are formed on the sacrificial substrate 5 where the inspection probe 20 and the sensing probe 22 have been formed.

Referring to FIG. 2(d), a conductive material is deposited by plating into the space portion formed between the third passivation patterns 25, thereby forming the signal projecting portion 30.

Thereafter, the same processes as in FIGS. 1(a) to 1(k) are performed to bond the inspection probe 20 and the sensing probe 22 to bumps 55 and 54 formed on a multi-layer circuit board 35, thereby completing a probe card.

FIG. 3 is a schematic view of a system for inspecting the probe card manufactured by the methods illustrated in FIGS. 1 and 2.

Referring to FIG. 3, the probe card inspection system includes: a multi-layer circuit board 35 having one or more connection terminals 40 and lines 45 receiving an external electrical signal; bumps 55 disposed on the connection terminals 40; a plurality of cantilever-type inspection probes 20 each having a tip portion pressed to contact a pad of a semiconductor chip and a beam portion bonded to the bump 55; a sensing unit sensing an OD applied to the inspection probe 20; and a probe card inspection device 60.

The sensing unit includes: a sensing probe 22 bonded through a separate bump 54 to the connection terminal 40 of the multi-layer circuit board 35, a signal projecting portion 30 formed on a partial upper surface of a beam portion 22a corresponding to a tip portion 22b of the sensing probe 22, and a sensing signal connection terminal 50 disposed on a surface of the multi-layer circuit board 35, which faces the signal projecting portion 30, to output the external electrical signal to the outside when the OD exceeds a predetermined level.

The signal projecting portion 30 is formed to such a height that it contacts the sensing signal connection terminal 50 if the OD exceeds the predetermined level and vice versa.

The probe card inspection device 60 includes: a controller 61 receiving an electrical signal corresponding to the level of OD sensed by the sensing unit and then comparing the sensed OD level with the predetermined OD level to control the entire system; an inspection device driving unit 62 driving the probe card inspection device 60 under the control of the controller 61; a display unit 63 displaying the OD amount according to a control signal of the controller 61; and an alarming unit 64 generating an alarm signal according to the control signal of the controller 61.

The operations of the probe card and the probe card inspection system will now be described in detail with reference to FIG. 3.

Referring to FIG. 3(b), when the tip portion 20b of the inspection probe 20 is pressed by an external physical force to contact an inspection pad 1 and a further external physical force is applied to make the OD exist within a first range corresponding to a predetermined interval d1, the inspection probe 20 is flexed within the range of the predetermined interval d1. Therefore, the sensing probe 22 maintains a predetermined distance with respect to the sensing signal connection terminal 50. Accordingly, a low-level electrical signal is inputted to the controller 61 of the probe card inspection device 60 through the sensing signal connection terminal 50 and the connection terminal 40 connected by a line 45.

Referring to FIG. 3(c), when an external physical force is applied to make the OD deviate from the first range, the inspection probe 20 is flexed to a second range of a predetermined interval d2 deviating from the first range. Therefore, the same external physical force is applied also to the sensing probe 20 and thus the signal projecting portion 30 is brought into contact with the sensing signal connection terminal 50. Accordingly, a high-level electrical signal is inputted to the controller 61 of the probe card inspection device 60 through the line 45 and the connection terminal 40.

In this case, under the control of the controller 61, the probe card inspection device 60 stops the probe card inspection operation, and the display unit 63 displays the current state to an operator.

Also, under the control of the controller 61, the alarming unit 64 outputs an alarm signal so that other operators or a manager can perceive the current state. The alarm signal may be a buzzer sound, an electronic audio signal, a voice guidance message, or the like.

In addition, an OD sensing information generated during the operation of the probe card may be stored in a storage unit (not illustrated) so that it can be utilized even after termination of the pad inspection process.

Mode for the Invention

Other embodiments of the present invention will now be described in detail.

EMBODIMENT 1

In embodiment 1, a beam portion 21a of a sensing probe 21 is formed longer than a beam portion 20a of an inspection probe 20, and a tip portion 21b is formed on a lower surface of the beam portion 21a at a point spaced apart from the end of the beam portion 21a by a predetermined distance. An over drive (OD) can be sensed in the same manner as in the best mode embodiment. In describing Embodiment 1, the same elements as in the best mode embodiment are denoted by the same reference numerals, and the descriptions about overlapping processes will be omitted for conciseness.

FIG. 4 is a sectional view illustrating a method of manufacturing a probe card including an OD sensing probe according to another embodiment of the present invention.

Referring to FIGS. 4(a) to 4(d), the same processes as in FIGS. 1(a) to 1(d) are performed to form trenches for forming the tip portions of the probes and to form a seed layer 10 on a sacrificial substrate 5 where the trenches have been formed. Referring to FIG. 4(e), first passivation patterns 15 with pattern spaces corresponding to the beam portions 20a and 21a are formed on the sacrificial substrate 5.

Referring to FIG. 4(f), a conductive material is deposited by plating into the trenches and the pattern spaces exposed through the first passivation patterns 15, thereby forming the inspection probe 20 and the sensing probe 21. Consequently, the inspection probe 20 is constructed to include the beam portion 20a and the tip portion 20b formed in a body with the end of the beam portion 20a, and the sensing probe 21 is formed to include the beam portion 21a and the tip portion 21b formed on a lower surface of the beam portion 21a at a point spaced apart from the end of the beam portion 21a by a predetermined distance.

A probe card fabrication process is the same as in the best mode embodiment, and thus its description will be omitted for conciseness.

FIG. 5 is a sectional view illustrating another method of manufacturing the inspection probe and the sensing probe illustrated in FIG. 4. In this method, a wet etching process and an anisotropic dry etching process are sequentially performed to form the inspection probe and the sensing probe in a sacrificial substrate 5. The same elements as in the best mode embodiment are denoted by the same reference numerals, and their description will be omitted for conciseness.

Referring to FIG. 5(a), after formation of first passivation patterns 15 having a pattern space with the shape of the section of the beam portion 20a and another pattern space with the shape of the section of the beam portion 21a, a wet etching process and an anisotropic dry etching process are sequentially performed to form spaces for forming the inspection probe 20 and the sensing probe 21 that has the tip portion 21b formed on a lower surface of the beam portion 21 at a point spaced apart from the end of the beam portion 21a by a predetermined distance.

Referring to FIG. 5(b), a conductive material is deposited by plating into the formed pattern spaces, thereby forming the inspection probe 20 and the sensing probe 21. Consequently, the inspection probe 20 is formed to include the beam portion 20a and the tip portion 20b formed in a body with the end of the beam portion 20a, and the sensing probe 21 is formed to include the beam portion 21a and the tip portion 21b formed on a lower surface of the beam portion 21a at a point spaced apart from the end of the beam portion 21a by a predetermined distance.

The probe card manufactured by the methods illustrated in FIGS. 4 and 5 is substantially identical to that of the best mode embodiment with the exception that the sensing probe 21 of a sensing unit has the beam portion 21a and the tip portion 21b formed on a lower surface of the beam portion 21a at a point spaced apart from the end of the beam portion 21a by a predetermined distance. Therefore, only the sensing unit will be described, for conciseness.

The sensing unit includes: the sensing probe 21 bonded through a bump 54 to a connection terminal 40 of a multi-layer circuit board 35, the sensing probe 21 including a beam portion 21a and a tip portion 21b formed on a lower surface of the beam portion 21a at a point spaced apart from one end of the beam portion 21a by a predetermined distance; and a sensing signal connection terminal 50 disposed on a surface of the multi-layer circuit board 35 at a position opposite to the bump 54-side end of the beam portion 21a so as to output an electrical signal to the outside when an OD exceeds a predetermined level.

A probe card inspection device 60 with the above sensing unit is identical to that of the best mode embodiment, and thus its detailed description will be omitted for conciseness.

FIG. 6 is a schematic view of a system for inspecting a probe card using the inspection and sensing probes manufactured by the methods illustrated in FIGS. 4 and 5.

Referring to FIG. 6, when an OD is generated at the inspection probe 20 by an external physical force applied from the outside, the end of the beam portion 21a is selectively connected to the sensing signal connection terminal 50 depending on the generation range of the OD. In response to an electrical signal from the sensing signal connection terminal 50, a controller 61 of a probe card inspection device 60 controls an inspection device driving unit 62, a display unit 63, and an alarming unit 64 in the same manner as in the best mode embodiment.

EMBODIMENT 2

In embodiment 2 illustrated in FIGS. 7 and 8, a bump 55 bonded to an inspection probe 20 is formed taller than a bump 54 bonded to a sensing probe 80, and a beam portion 80a of the sensing probe 80 is formed thicker than those of the previous embodiments. In describing Embodiment 2, the same elements as in the best mode embodiment are denoted by the same reference numerals, and the descriptions about overlapping processes will be omitted for conciseness.

Referring to FIG. 7(a), a multi-layer circuit board 35 is prepared, and first passivation patterns 65 with a plurality of bump section patterns are formed on the multi-layer circuit board 35.

Referring to FIG. 7(b), a conductive material is deposited by plating in the bump section patterns exposed through the first passivation patterns 65, thereby forming bumps 54 and 55.

Referring to FIG. 7(c), second passivation patterns 64 for selectively exposing the bump 55 is formed.

Referring to FIG. 7(d), a conductive material is deposited by plating in a space exposed by the second passivation patterns 64, thereby increasing the height of the bump 55.

Referring to FIGS. 7(e) to 7(g), a sensing probe and an inspection probe bonded to the bumps 54 and 55 are formed in the same processes as in FIGS. 1(a) to 1(f).

As above, by etching process, an inspection probe 20 having a beam portion 20a and a tip portion 20b formed in a body with an end of the beam portion 20a and a sensing probe 80 having a beam portion 80a and a tip portion 80b formed in a body with an end of the beam portion 80a are formed in a sacrificial substrate 5.

Referring to FIG. 7(h), third passivation patterns 85 for growing the beam portion 80a is formed on the beam portion 80a.

Referring to FIGS. 7(i) and 7(j), a conductive material is deposited by plating in a space exposed through the third passivation patterns 85, thereby growing only the beam portion 80a of the sensing probe 80.

The first, second and third passivation patterns 65, 64 and 85 are removed by a wet etching process.

Referring to FIG. 7(k), one end portions of the inspection and sensing probes 20 and 80 are bonded to the bumps 55 and 54 formed on the multi-layer circuit board 35.

Referring to FIG. 7(l), the sacrificial substrate 5 is removed to expose the inspection probe 20 and the sensing probe 80.

Meanwhile, a embodiment of FIG. 8 is different from the embodiment of FIG. 7 in that a beam portion 20a of an inspection probe 20 and a beam portion 80a of a sensing probe 80 are formed on a sacrificial substrate 5.

That is, the inspection probe 20 having the beam portion 20a and a tip portion 20b formed in a body with an end of the beam portion 20a and the sensing probe 80 having the beam portion 80a and a tip portion 80a formed in a body with an end of the beam portion 80a are manufactured in the same method as in FIGS. 1(a) to 1(f).

Referring to FIG. 8(a), after the inspection probe 20 and the sensing probe 80 are formed on the sacrificial substrate 5, passivation patterns 75 for growing only the beam portion 80a is formed on the sacrificial substrate 5. A reference numeral 15 denotes passivation patterns for forming the inspection probe 20 and the sensing probe 80.

Referring to FIG. 8(b), a conductive material is deposited by plating in a space exposed through the passivation patterns 75, thereby growing only the beam portion 80a of the sensing probe 80.

The subsequent processes are the same as those in FIG. 7 and thus their description will be omitted for conciseness.

The probe card manufactured by the methods illustrated in FIGS. 7 and 8 is substantially identical to that of the best mode embodiment with the exception that a sensing unit is different from that of the best mode embodiment. Therefore, only the sensing unit will be described for conciseness.

That is, as illustrated in FIG. 9, the sensing unit includes: the sensing probe 80 having the grown beam portion 80a and bonded through a bump 54 to a connection terminal 40 of a multi-layer circuit board 35; and a sensing signal connection terminal 50 disposed on a surface of the multi-layer circuit board 35 at a position opposite to a bump 54-side end of the beam portion 80a in order to output an electrical signal to the outside when an OD exceeds a predetermined level.

A probe card inspection device 60 with the above sensing unit is identical to that of the best mode embodiment, and thus its detailed description will be omitted for conciseness.

That is, when the OD is generated at the inspection probe 20 by an external physical force applied from the outside, the end of the beam portion 80a is selectively connected to the sensing signal connection terminal 50 depending on the generation range of the OD. In response to the electrical signal from the sensing signal connection terminal 50, a controller 61 of the probe card inspection device 60 controls an inspection device driving unit 62, a display unit 63, and an alarming unit 64 in the same manner as in the best mode embodiment.

EMBODIMENT 3

In embodiment 3 illustrated in FIG. 10, a bump 55 bonded to an inspection probe 20 is formed to have different height than a bump 54 bonded to a sensing probe 22.

Referring to FIG. 10(a), first passivation patterns 65 for forming bumps are formed on a multi-layer circuit board 35.

Referring to FIG. 10(b), a conductive material is deposited by plating in spaces exposed through the first passivation patterns 65, thereby forming bumps 54 and 55.

Referring to FIG. 10(c), second passivation patterns 64 for selectively growing the bump 55 is formed on the multi-layer circuit board 35 on which the bumps 55 and 54 have been formed.

Referring to FIG. 10(d), a conductive material is deposited by plating in a space exposed by the second passivation patterns 64, thereby growing only the bump 55.

Thereafter, an inspection probe 20 is formed in the same processes as in FIGS. 1(a) to 1(f).

Referring to FIG. 10(e), the inspection probe 20 having a beam portion 20a and a tip portion 20b formed in a body with an end of the beam portion 20a is bonded to the bump 55 formed on the multi-layer circuit board 35, and then a sacrificial substrate 5 is removed by a wet etching process.

Referring to FIG. 10(f), a sensing probe 22 having a beam portion 22a and a tip portion 22b formed in a body with an end of the beam portion 22a is individually bonded to the bump 54 formed on the multi-layer circuit board 35 using a laser bonding device. The sensing probe 22 is formed in the same method as for the inspection probe 20.

At this time, the beam portion 20a of the inspection probe 20 has the same thickness as the beam portion 22a of the sensing probe 22. As illustrated in FIG. 11, the bumps 55 and 54 have different heights such that an end of the beam portion 22a of the sensing probe 22 does not contact a sensing signal connection terminal 50 when the inspection probe 20 operates within a predetermined OD range, but contacts the sensing signal connection terminal 50 when the operating range of the inspection probe 20 exceeds the predetermined OD range.

The probe card manufactured by the method illustrated in FIG. 10 is substantially identical to that of the best mode embodiment with the exception that a sensing unit is different from that of the best mode embodiment. Therefore, only the sensing unit will be described for conciseness.

The sensing unit includes: the sensing probe 22 bonded through the bump 54 with a lower height than the bump 55 of the inspection probe 20 to a connection terminal 40 of a multi-layer circuit board 35; and a sensing signal connection terminal 50 disposed on a surface of the multi-layer circuit board 35 at a position opposite to a bump 54-side end of the beam portion 22a in order to output an electrical signal to the outside when an OD exceeds a predetermined level.

A probe card inspection device 60 with the above sensing unit is identical to that of the best mode embodiment, and thus its detailed description will be omitted for conciseness.

That is, when the OD is generated at the inspection probe 20 by an external physical force applied from the outside, the end of the beam portion 22a is selectively connected to the sensing signal connection terminal 50 depending on the generation range of the OD. In response to the electrical signal from the sensing signal connection terminal 50, a controller 61 of the probe card inspection device 60 controls an inspection device driving unit 62, a display unit 63, and an alarming unit 64 in the same manner as in the best mode embodiment.

EMBODIMENT 4

In embodiment 4 illustrated in FIG. 12, a signal projecting portion 95 is formed on a multi-layer circuit board 35 in order to sense an OD of a probe.

Referring to FIG. 12(a), after the multi-layer circuit board 35 is prepared, the signal projecting portion 95 is formed on the multi-layer circuit board 35 at a position corresponding to a tip portion of a sensing probe and first passivation patterns 65 for forming bumps are formed.

Referring to FIG. 12(b), a conductive material is deposited by plating in spaces exposed through the first passivation patterns 65, thereby forming the signal projecting portion 95 and bumps 54 and 55.

Thereafter, second passivation patterns 64 for interposing a bump higher than the signal projecting portion 95 between the multi-layer circuit board 35 and the inspection probe and a beam portion of the sensing probe are formed as illustrated in FIG. 12(c).

Referring to FIG. 12(d), a conductive material is deposited by plating in a space exposed by the second passivation patterns 64, thereby forming grown bumps 55 and 54.

Referring to FIG. 12(e), the first and second passivation patterns 65 and 64 are removed by a wet etching process.

Thereafter, an inspection probe 20 and a sensing probe 22 are formed in the same processes as in FIGS. 1(a) to 1(f).

Referring to FIG. 12(f), the inspection probe 20 having a beam portion 20a and a tip portion 20b formed in a body with an end of the beam portion 20a and the sensing probe 22 having a beam portion 22a and a tip portion 22a formed in a body with an end of the beam portion 22a are simultaneously bonded to the bumps 55 and 54 formed on the multi-layer circuit board 35.

Referring to FIG. 12(g), the sacrificial substrate 5 is removed by a wet etching process, thereby exposing the inspection probe 20 and the sensing probe 22.

The probe card manufactured by the method illustrated in FIG. 12 is substantially identical to that of the best mode embodiment with the exception that the signal projecting portion for sensing the OD of a probe is formed on the multi-layer circuit board 35. Therefore, only a sensing unit will be described for conciseness.

Referring to FIG. 13, a sensing unit includes: the sensing probe 22 bonded through the bump 54 to a connection terminal 40 of the multi-layer circuit board 35; a sensing signal connection terminal 50 disposed on the multi-layer circuit board 35 at a position corresponding to the tip portion 22b of the sensing probe 22; and a signal projecting portion 95 formed on the sensing signal connection terminal 50 to be lower than the bumps 55 and 54.

A probe card inspection device 60 with the above sensing unit is identical to that of the best mode embodiment, and thus its detailed description will be omitted for conciseness.

That is, when an OD is generated at the inspection probe 20 by an external physical force applied from the outside, the end of the beam portion 22a is selectively connected to the signal projecting portion 95 connected to the sensing signal connection terminal 50 depending on a generation range of the OD. In response to a electrical signal from the sensing signal connection terminal 50, a controller 61 of the probe card inspection device 60 controls an inspection device driving unit 62, a display unit 63, and an alarming unit 64 in the same manner as in the best mode embodiment.

Each of the sensing probes of the above embodiments is configured to contact a dummy pad of a semiconductor chip, and the sensing unit may be replaced by a contact sensor, a pressure sensor, or an optical sensor.

FIG. 14 illustrates an embodiment in which the sensing probes manufactured by the above embodiments are applied to a probe card. In this embodiment, the sensing probes are disposed at various positions in order to sense the OD of a probe and the planarity of a silicon wafer with respect to the probe card.

FIG. 15 illustrates a dummy pad contacting a sensing probe. Referring to FIGS. 15(a) and 15(b), inspected pads contacting the tips of the inspection probes are disposed in a region ① of a wafer and a dummy pad contacting a tip of a sensing probe is disposed in a region ③ of the wafer such that they are matched to a probe card with the inspection probe and the sensing probe.

That is, as illustrated in FIG. 15, the tip of the inspection probe contacts an upper portion of an inspected pad 1 and the tip of the sensing probe contacts an upper portion of a dummy pad 2 such that the planarity of the OD wafer can be sensed and transmitted to the probe card inspection device.

INDUSTRIAL APPLICABILITY

The probe card manufacturing method, the probe card, and the probe card inspection system according to the present invention can be used to inspect a semi-conductor device.

The invention claimed is:

1. A probe card comprising:
   a multi-layer circuit board having one or more bumps receiving external electrical signals;
   a cantilever-type inspection probe having a bar-type beam portion, an upper surface of one end of the bar-type beam portion being bonded to the bump of the multi-layer circuit board, and a tip portion attached to a lower surface of the other end of the beam portion and configured to contact a pad of a semiconductor chip by pressure;
   and a sensing unit configured to sense the level of over drive applied to the inspection probe when the inspection probe is brought into contact with the pad of the semiconductor chip and to have a cantilever-type sensing probe and a signal connection terminal disposed on the multi-layer circuit board to contact a part of the cantilever-type sensing probe when the drive exceeds a predetermined level.

2. The probe card of claim 1, wherein the
   cantilever-type sensing probe comprises a bar-type beam portion, an upper surface of one end of the bar-type beam portion being bonded to the bump of the multi-layer circuit board, a signal projecting portion being provided on an upper surface of the other end of the bar-type beam portion, and a tip portion attached to a lower surface of the other end of the beam portion and configured to contact the pad of the semiconductor chip by pressure, and the signal connection terminal contacts the signal projecting portion when the over drive exceeds a predetermined level.

3. The probe card of claim 1, wherein the cantilever-type sensing probe comprises a bar-type beam portion, an upper surface of one end of the bar-type beam portion being bonded to the bump of the multi-layer circuit board, and a tip portion attached to a lower surface of the center portion of the beam portion and configured to contact the pad of the semi-conductor chip by pressure, and the signal connection terminal contacts the other end of the bar-type beam portion when the over drive exceeds a pre-determined level.

4. The probe card of claim 1, wherein the cantilever-type sensing probe comprises a bar-type beam portion, an upper surface of one end of the bar-type beam portion being bonded to the bump of the multi-layer circuit board, and a tip portion attached to a lower surface of the other end of the beam portion and configured to contact the pad of the semiconductor chip by pressure, and the signal connection terminal contacts the other end of the bar-type beam portion when the over drive exceeds a pre-determined level,
  wherein the beam portion of the cantilever-type sensing probe is thicker than the beam portion of the inspection probe.

5. The probe card of claim 1, wherein the cantilever-type sensing probe comprises a bar-type beam portion, an upper surface of one end of the bar-type beam portion being bonded to the bump of the multi-layer circuit board, and a tip portion attached to a lower surface of the other end of the beam portion and configured to contact the pad of the semiconductor chip by pressure, and the signal connection terminal contacts the other end of the bar-type beam portion when the over drive exceeds a pre-determined level,
  wherein the bump bonded to the inspection probe is thicker than the bump bonded to the sensing probe.

6. A probe card comprising:
  a multi-layer circuit board having one or more bumps receiving external electrical signals;
  a cantilever-type inspection probe having a bar-type portion, an upper surface of one end of the bar-type beam portion being bonded to the bump of the multi-layer circuit board, and a tip portion attached to a lower surface of the other end of the beam potion and configured to contact a pad of a semiconductor chip by pressure; and
  a sensing unit configured to sense the level of over drive applied to the inspection probe when the inspection probe is brought into contact with the pad of the semiconductor chip,
  wherein the sensing unit comprises:
    a cantilever-type sensing probe having a bar-type beam portion, an upper surface of one end of the bar-type beam portion being bonded to the bump of the multi-layer circuit board, and a tip portion attached to a lower surface of the other end of the beam portion and configured to contact the pad of the semiconductor chip by pressure;
    a signal projecting portion disposed on the multi-layer circuit board at a position corresponding to the tip portion of the sensing probe; and
    a signal connection terminal disposed on the multi-layer circuit board to sense that the other end of the bar-type beam portion is brought into contact with the signal projecting portion when the over drive exceeds a pre-determined level, wherein the bump bonded to the sensing probe is thicker than the signal projecting portion.

7. A probe card inspection system comprising:
  a probe card including:
  a multi-layer circuit board having one or more connection terminals receiving external electrical signals;
  bumps disposed on the connection terminals of the multi-layer circuit board;
  an cantilever-type inspection probe having a bar-type beam portion, an upper surface of one end of the bar-type beam portion being bonded to the bump of the multi-layer circuit board, and a tip portion attached to a lower surface of the other end of the beam portion and configured to contact a pad of a semiconductor chip by pressure;
  and a sensing unit configured to sense the level of an over drive applied to the inspection probe; and to have a cantilever-type sensing probe and a signal connection terminal disposed on the multi-layer circuit board to contact a part of the cantilever-type sensing probe when the over drive exceeds a predetermined level;
  a controller receiving an electrical signal corresponding to the level of the over drive sensed by the sensing unit, and comparing the sensed level of the over drive with a predetermined over drive level to control the probe card inspection system;
  an inspection device driving unit controlling an operation of an inspection device under the control of the controller; and
  a display unit displaying the over drive level according to a control signal of the controller.

8. The probe card inspection system of claim 7, further comprising an alarming unit generating an alarm signal in response to the control signal of the controller.

9. The probe card inspection system of claim 7, wherein the sensing probe contacts a dummy pad of the semiconductor chip.

10. A probe card comprising:
  a multi-layer circuit board having one or more bumps receiving external electrical signals;
  a cantilever-type inspection probe having a bar-type beam portion, an upper surface of one end of the bar-type beam portion being bonded to the bump of the multi-layer circuit board, and a tip portion attached to a lower surface of the other end of the beam portion and configured to contact a pad of a semiconductor chip by pressure;
  and a sensing unit configured to sense the level of over drive applied to the inspection probe when the inspection probe is brought into contact with the pad of the semiconductor chip, wherein the sensing unit comprises:
    a cantilever-type sensing probe having a bar-type beam portion, an upper surface of one end of the bar-type beam portion being bonded to the bump of the multi-layer circuit board, a signal projecting portion being provided on an upper surface of the other end of the bar-type beam portion, and a tip portion attached to a lower surface of the other end of the beam portion and configured to contact the pad of the semiconductor chip by pressure; and
    a signal connection terminal disposed on the multi-layer circuit board to contact the other end of the bar-type beam portion when the over drive exceeds a pre-determined level.

11. A probe card comprising:
  a multi-layer circuit board having one or more bumps receiving external electrical signals;
  a cantilever-type inspection probe having a bar-type beam portion, an upper surface of one end of the bar-type beam portion being bonded to the bump of the multi-layer circuit board, and a tip portion attached to a lower surface of the other end of the beam portion and configured to contact a pad of a semiconductor chip by pressure;
  and a sensing unit configured to sense the level of over drive applied to the inspection probe when the inspection probe is brought into contact with the pad of the semiconductor chip, wherein the sensing unit comprises:
    a cantilever-type sensing probe having a bar-type beam portion, an upper surface of one end of the bar-type beam portion being bonded to the bump of the multi-layer circuit board, and a tip portion attached to a lower surface of the other end of the beam portion and configured to contact the pad of the semiconductor chip by pressure; and a signal connection terminal disposed on the multi-layer circuit board to contact the other end of the bar-type beam portion when the over drive exceeds a predetermined level.

12. A probe card comprising:

a multi-layer circuit board having one or more bumps receiving external electrical signals;

a cantilever-type inspection probe having a bar-type beam portion, an upper surface of one of the bar-type beam portion being bonded to the bump of the multi-layer circuit board, and a tip portion attached to a lower surface of the other end of the beam and configured to contact a pad of a semiconductor chip by pressure;

and a sensing unit configured to sense the level of over drive applied to the inspection probe when the inspection probe is brought into contact with the pad of the semiconductor chip, wherein the sensing unit comprises:

a cantilever-type sensing probe having a bar-type beam portion, an upper surface of one end of the bar-type beam portion being bonded to the bump of the multi-layer circuit board, and a tip portion attached to a lower surface of the other end of the beam portion and configured to contact the pad of the semiconductor chip by pressure; and a signal connection terminal disposed on the multi-layer circuit board to contact the other end of the bar-type beam portion when the over drive exceeds a predetermined level, wherein the beam portion of the cantilever-type sensing probe is thicker than the beam portion of the inspection probe.

13. A probe card comprising:

a multi-layer circuit board having one or more bumps receiving external electrical signals;

a cantilever-type inspection probe having a bar-type beam portion, an upper surface of one end of the bar-type beam portion being bonded to the bump of the multi-layer circuit board, and a tip portion attached to a lower surface of the other end of the beam portion and configured to contact a pad of a semiconductor chip by pressure;

and a sensing unit configured to sense the level of over drive applied to the inspection probe when the inspection probe is brought into contact with the pad of the semiconductor chip, wherein the sensing unit comprises:

a cantilever-type sensing probe having a bar-type beam portion, an upper surface of one end of the bar-type beam portion being bonded to the bump of the multi-layer circuit board, and a tip portion attached to a lower surface of the other end of the beam portion and configured to contact the pad of the semiconductor chip by pressure; and a signal connection terminal disposed on the multi-layer circuit board to contact the other end of the bar-type beam portion when the over drive exceeds a predetermined level, wherein the bump bonded to the inspection probe is thicker than the bump bonded to the sensing probe.

* * * * *